(12) United States Patent
Wu et al.

(10) Patent No.: US 10,707,214 B2
(45) Date of Patent: Jul. 7, 2020

(54) FABRICATING METHOD OF COBALT SILICIDE LAYER COUPLED TO CONTACT PLUG

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Chia-Chen Wu, Nantou County (TW); Yi-Wei Chen, Taichung (TW); Chi-Mao Hsu, Tainan (TW); Kai-Jiun Chang, Taoyuan (TW); Chih-Chieh Tsai, Kaohsiung (TW); Pin-Hong Chen, Tainan (TW); Tsun-Min Cheng, Changhua County (TW); Yi-An Huang, New Taipei (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/990,837

(22) Filed: May 29, 2018

(65) Prior Publication Data

US 2019/0027479 A1 Jan. 24, 2019

(30) Foreign Application Priority Data

Jul. 18, 2017 (CN) .......................... 2017 1 0584713

(51) Int. Cl.
*H01L 27/108* (2006.01)
*C23C 14/06* (2006.01)
*C23C 14/34* (2006.01)
*C23C 14/58* (2006.01)
*H01L 21/285* (2006.01)

(52) U.S. Cl.
CPC .... *H01L 27/10855* (2013.01); *C23C 14/0682* (2013.01); *C23C 14/34* (2013.01); *C23C 14/5806* (2013.01); *H01L 21/2855* (2013.01); *H01L 27/10814* (2013.01); *H01L 21/28518* (2013.01); *H01L 27/10823* (2013.01)

(58) Field of Classification Search
CPC ..................... H01L 21/28518; C23C 14/5806
See application file for complete search history.

(56) References Cited

U.S. PATENT DOCUMENTS 6,146,994 A 11/2000 Hwang
6,184,132 B1 * 2/2001 Cantell ............. H01L 21/28518
257/E21.165

(Continued)

*Primary Examiner* — William F Kraig
*Assistant Examiner* — Khatib A Rahman
(74) *Attorney, Agent, or Firm* — Winston Hsu

(57) ABSTRACT

A method of fabricating a cobalt silicide layer includes providing a substrate disposed in a chamber. A deposition process is performed to form a cobalt layer covering the substrate. The deposition process is performed when the temperature of the substrate is between 50° C. and 100° C., and the temperature of the chamber is between 300° C. and 350° C. After the deposition process, an annealing process is performed to transform the cobalt layer into a cobalt silicide layer. The annealing process is performed when the substrate is between 300° C. and 350° C., and the duration of the annealing process is between 50 seconds and 60 seconds.

7 Claims, 3 Drawing Sheets

(56) References Cited

U.S. PATENT DOCUMENTS

| | | | | |
|---|---|---|---|---|
| 6,306,698 B1* | 10/2001 | Wieczorek | ........ | H01L 29/66507 |
| | | | | 257/E21.439 |
| 8,518,772 B2 | 8/2013 | Bai | | |
| 2004/0203233 A1* | 10/2004 | Kang | ...................... | C23C 16/16 |
| | | | | 438/686 |
| 2008/0268635 A1* | 10/2008 | Yu | ....................... | C23C 16/0227 |
| | | | | 438/655 |
| 2011/0124192 A1* | 5/2011 | Ganguli | .................. | C23C 16/18 |
| | | | | 438/653 |
| 2013/0119505 A1* | 5/2013 | Harame | .................. | H01L 29/47 |
| | | | | 257/484 |
| 2013/0264655 A1* | 10/2013 | Kishida | ................ | H01L 23/535 |
| | | | | 257/392 |
| 2016/0017482 A1* | 1/2016 | Trivedi | ................ | C23C 16/045 |
| | | | | 427/250 |
| 2016/0133563 A1* | 5/2016 | Ai | ..................... | H01L 21/28562 |
| | | | | 438/628 |

* cited by examiner

FABRICATING METHOD OF COBALT SILICIDE LAYER COUPLED TO CONTACT PLUG

BACKGROUND OF THE INVENTION

1. Field of the Invention

The present invention relates to a method of fabricating a cobalt silicide layer, and more particularly, to a cobalt silicide layer which electrically connects to a capacitor plug.

2. Description of the Prior Art

With the decreased size of semiconductor devices, the sheet resistance of electrically-conducting structures, such as the gates of MOS transistors, emitters of bipolar transistors, contact plugs, and interconnect lines connecting the above devices together, begins to limit the speed of operation.

One well-known technique for reducing sheet resistance is to form a layer of metal silicide over these electrically-conducting structures. The silicide layer formed by a conventional method often has a rough surface, however, which increases the sheet resistance between the silicide layer and the electrically-conducting structures.

SUMMARY OF THE INVENTION

Therefore, it would be an advantage in the art to provide a method of fabricating a silicide layer with a smooth surface.

According to a preferred embodiment of the present invention, a fabricating method of a cobalt silicide layer coupled to a contact plug includes providing a substrate disposed within a chamber. Next, a deposition process is performed. The deposition process includes forming a cobalt layer to cover the substrate when a temperature of the substrate is between 50° C. and 100° C., and a temperature of the chamber is between 300° C. and 350° C. Finally, after the deposition process, an annealing process is performed when a temperature of the substrate is between 300° C. and 350° C. to transform the cobalt layer into a cobalt silicide layer, wherein the duration of the annealing process is between 50 seconds and 60 seconds.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 2 to FIG. 5 depict a fabricating method of a cobalt silicide layer according to a preferred embodiment of the present invention, wherein:

FIG. 2 depicts a chamber with a substrate therein;
FIG. 3 is a fabricating stage following FIG. 2;
FIG. 4 is a fabricating stage following FIG. 3; and
FIG. 5 is a fabricating stage following FIG. 4.

DETAILED DESCRIPTION

Figure 1:
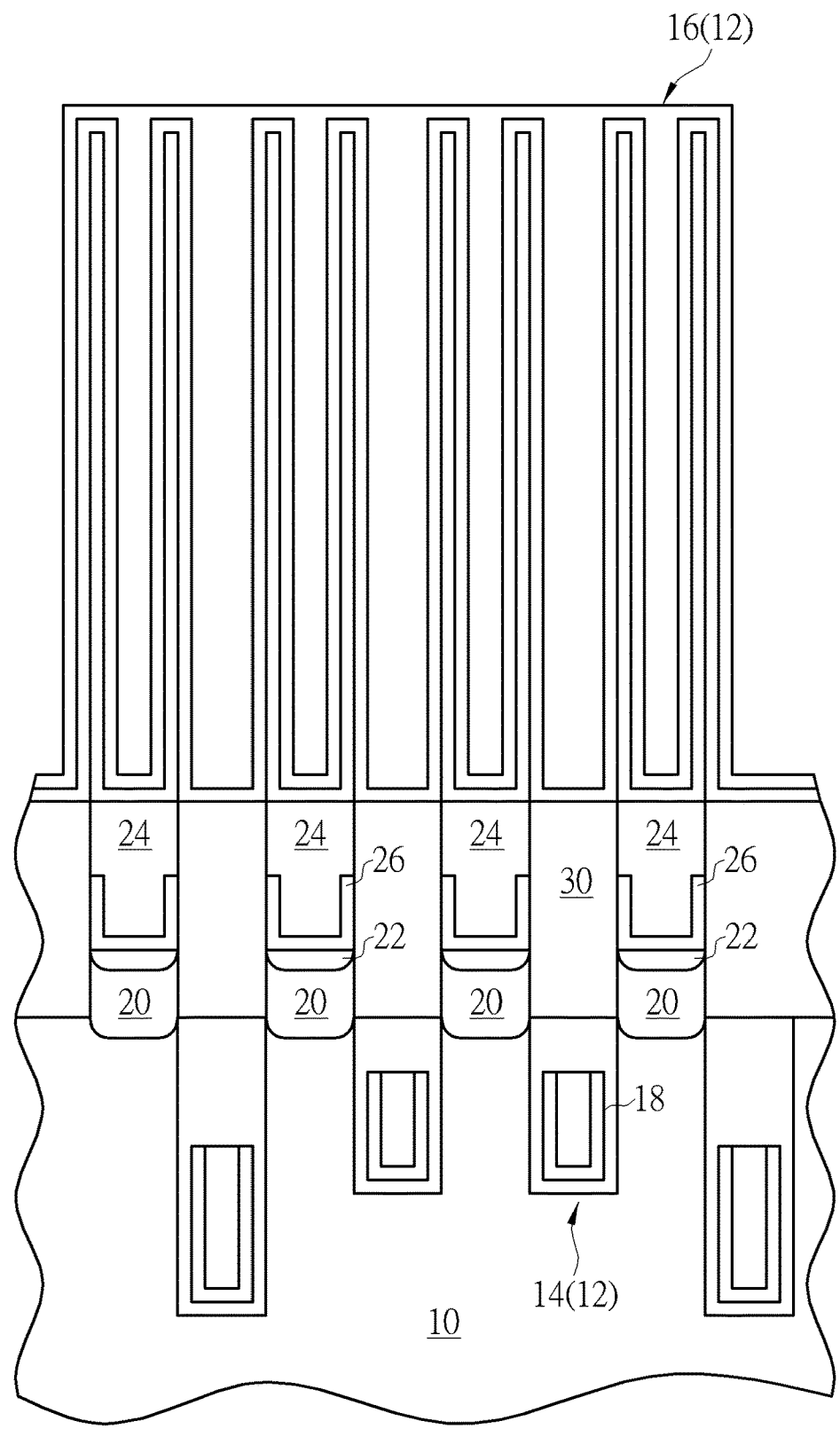
FIG. 1 depicts a Dynamic Random Access Memory (DRAM) according to a preferred embodiment of the present invention.

FIG. 1 depicts a Dynamic Random Access Memory (DRAM) according to a preferred embodiment of the present invention. The cobalt silicide layer in the DRAM is formed by the fabricating method provided in the present invention. As shown in FIG. 1, a substrate 10 is provided. Numerous cell units 12 of DRAMs are disposed on the substrate 10. Each cell unit 12 includes a transistor 14 and a capacitor structure 16. Each transistor 14 includes a buried gate 18 and a source/drain doped region 20. The buried gate 18 is disposed in the substrate 10. The source/drain doped region 20 is disposed at two sides of the buried gate 18. The source/drain doped region 20 can be an epitaxial layer or a doped region (not shown) formed in the substrate 10. The epitaxial layer may be SiP, SiGe, Ge or other epitaxial materials. Each of the source/drain doped regions 20 has a metal silicide layer disposed thereon. According to a preferred embodiment, the metal silicide layer is a cobalt silicide layer 22. A conductive plug 24 disposed on the cobalt silicide layer 22 couples to or electrically connects to the capacitor structure 16. The conductive plug 24 may be a contact plug or a capacitor plug. A barrier layer 26 can be optionally disposed between the conductive plug 24 and the cobalt silicide layer 22. The conductive plug 24 can be tungsten. The barrier layer 26 may include titanium and titanium nitride. A dielectric layer 30 is disposed between the conductive plug 24.

Figure 2:
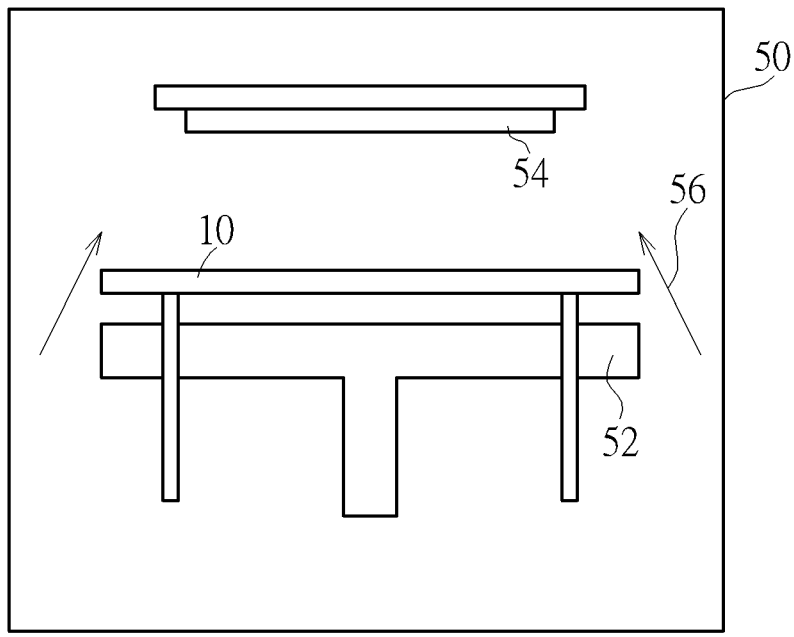
Figure 3:
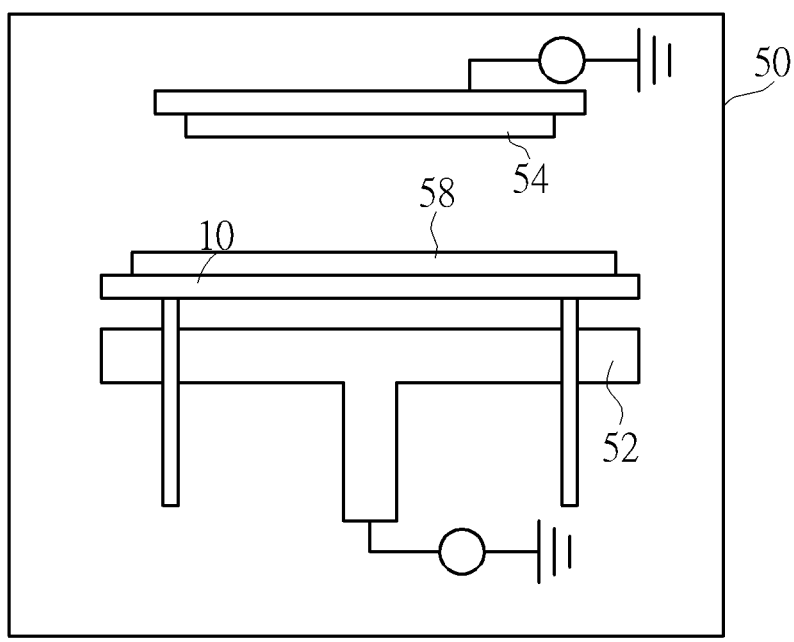

FIG. 2 to FIG. 5 depict a fabricating method of a cobalt silicide layer according to a preferred embodiment of the present invention, wherein elements which are substantially the same as those in FIG. 1 are denoted by the same reference numerals. The fabricating method of a cobalt silicide layer in this embodiment is suitable for manufacturing the cobalt silicide layer 22 shown in FIG. 1 or a cobalt silicide layer used in other devices. The following description illustrates the fabricating method of the cobalt silicide layer 22 in FIG. 1 as an example. As shown in FIG. 1 and FIG. 2, a chamber 50 is provided. A wafer stage 52 in the chamber 50 is used to support the substrate 10. A cobalt target 54 is fixed on an inner sidewall of the chamber 50. The substrate 10 includes the transistor 14 thereon, and the substrate 10 is at a fabricating step of forming the cobalt silicide layer 22 on the source/drain doped region 20. Later, argon gas 56 is introduced into the chamber 50. The argon gas 56 will be ionized to bombard the cobalt target 54 in subsequent steps. After that, the chamber 50 is heated to a temperature of 300° C. to 350° C. As shown in FIG. 1 and FIG. 3, a deposition process is performed. The plasma is activated, and voltage is applied to the cobalt target 54 and the wafer stage 52. The cobalt target 54 serves as a cathode and the wafer stage 52 serves as an anode. Later, a cobalt layer 58 is deposited on the surface of the substrate 10 by using the plasma. When forming the cobalt layer 58, the chamber 50 is heated to between 300° C. and 350° C. Furthermore, the deposition process is performed immediately after the chamber 50 is heated to a temperature between 300° C. and 350° C. and before the temperature of the substrate 10 is increased to the same temperature as the chamber 50. Therefore, during the deposition process, the temperature of the substrate 10 is maintained between 50° C. and 100° C. Elements such as the source/drain doped region 20 on the substrate 10 have the same temperature as that of the substrate 10. Therefore, the cobalt layer 58 on the substrate 10 will not be transformed into cobalt silicide. The cobalt layer 58 formed in the deposition process is entirely cobalt, with no cobalt silicide within.

Figure 4:
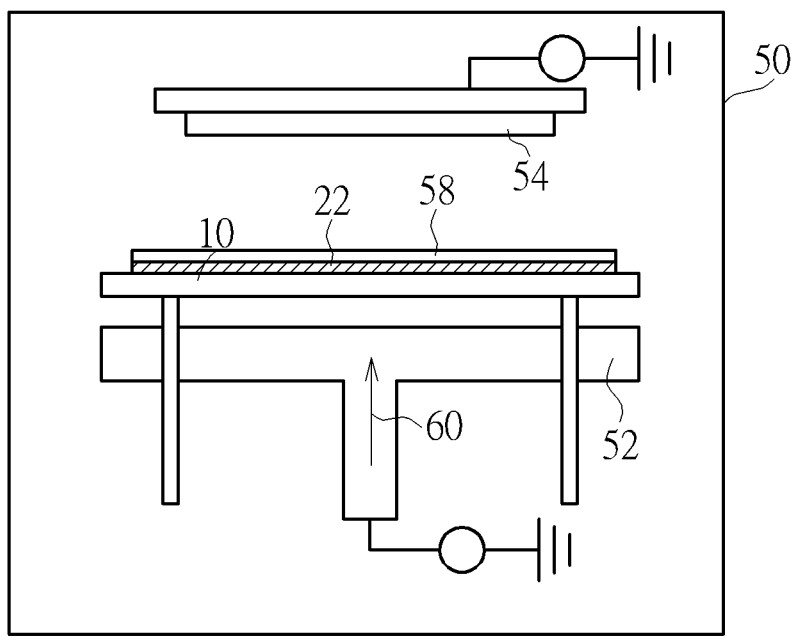

As shown in FIG. 1 and FIG. 4, an annealing process is performed including introducing ArH 60 to heat the substrate 10 to a temperature of 300° C. to 350° C. The duration of the annealing process is between seconds and 60 seconds.

Figure 5:
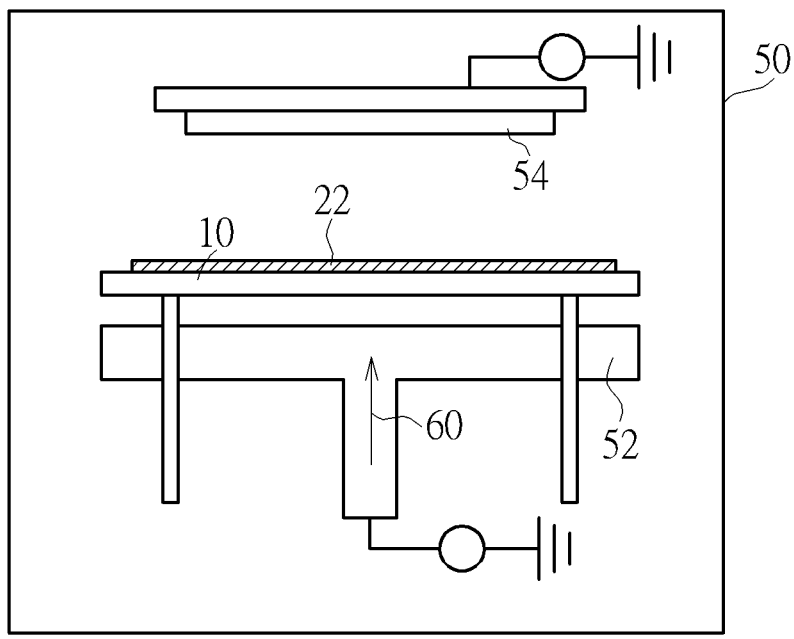

During the annealing process, the temperature of the chamber 50 is between 300° C. and 350° C. so that the cobalt layer 58 reacts with the source/drain doped region 20 and is transformed into a cobalt silicide layer 22. In this embodiment, the cobalt layer 58 is not entirely transformed into the cobalt silicide layer 22, i.e. some of the cobalt layer 58 remains on the cobalt silicide layer 22. As shown in FIG. 1 and FIG. 5, a rapid thermal anneal process is performed. An operational temperature of the rapid thermal anneal process is between 600° C. and 650° C. and an operational time of the rapid thermal anneal process is between 30 seconds and 60 seconds. The rapid thermal anneal process can make the distribution of the cobalt silicide layer 22 more uniform. Later, the cobalt layer 58 remaining on the cobalt silicide layer 22 is entirely removed. At this point, the cobalt silicide layer 22 is completed. In the following process, the barrier 26 and the conductive plug 24 are formed to electrically connect/couple to the cobalt silicide layer 22. Although the cobalt silicide layer 22 fabricated in the embodiment illustrated above is formed on the source/drain doped region 20, the fabricating process in the present invention can be used to manufacture a cobalt silicide layer in other positions such as on the gate or in a position which requires reduced sheet resistance.

In general, when the cobalt layer deposited on the substrate has a high temperature, the cobalt layer reacts with the silicon-containing material layer it contacts. A cobalt silicide layer formed by this reaction has a rough surface, however, which increases the sheet resistance between the conductive plug and the cobalt silicide layer. Therefore, the temperature of the deposition process in the present invention is controlled to be between 50° C. and 100° C. to guarantee that the cobalt layer is not transformed into the cobalt silicide layer during the deposition process. After the deposition process, an annealing process is used to heat the cobalt layer to transform the cobalt layer into a cobalt silicide layer. In this way, the cobalt silicide layer will have a smooth surface.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fabricating method of a cobalt silicide layer coupled to a contact plug, comprising:
   providing a substrate disposed within a chamber;
   performing a deposition process comprising forming a cobalt layer to cover the substrate before a temperature of the substrate is increased to a temperature of the chamber, wherein the deposition process is performed when the temperature of the substrate is between 50° C. and 100° C., and the temperature of the chamber is between 300° C. and 350° C.; and
   after the deposition process, performing an annealing process when the temperature of the substrate is between 300° C. and 350° C. to transform the cobalt layer into a cobalt silicide layer, wherein the duration of the annealing process is between 50 seconds and 60 seconds.

2. The fabricating method of a cobalt silicide layer coupled to a contact plug of claim 1, further comprising:
   after forming the cobalt silicide layer, performing a rapid thermal anneal process, wherein an operational temperature of the rapid thermal anneal process is between 600° C. and 650° C., and an operational time of the rapid thermal anneal process is between 30 seconds and 60 seconds.

3. The fabricating method of a cobalt silicide layer coupled to a contact plug of claim 2, further comprising:
   after the rapid thermal anneal process, removing the cobalt layer which is not transformed.

4. The fabricating method of a cobalt silicide layer coupled to a contact plug of claim 1, wherein during the annealing process, only part of the cobalt layer is transformed into the cobalt silicide layer.

5. The fabricating method of a cobalt silicide layer coupled to a contact plug of claim 1, wherein during the deposition process, the cobalt layer on a source/drain doped region is not transformed into the cobalt silicide layer.

6. The fabricating method of a cobalt silicide layer coupled to a contact plug of claim 1, further comprising:
   after forming the cobalt silicide layer, forming a capacitor plug coupling to the cobalt silicide layer.

7. The fabricating method of a cobalt silicide layer coupled to a contact plug of claim 1, wherein a transistor and a capacitor structure are disposed on the substrate, the transistor comprises a buried gate and a source/drain doped region, the cobalt silicide layer directly contacts the source/drain doped region, and a conductive plug electrically connects to the capacitor structure and the cobalt silicide layer.

* * * * *